United States Patent
Joo et al.

(10) Patent No.: US 7,829,885 B2
(45) Date of Patent: Nov. 9, 2010

(54) ORGANIC MEMORY DEVICES AND METHODS OF FABRICATING SUCH DEVICES

(75) Inventors: Won Jae Joo, Hwaseong-si (KR); Tae Lim Choi, Seongnam-si (KR); Jae Ho Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/601,661

(22) Filed: Nov. 20, 2006

(65) Prior Publication Data
US 2007/0176172 A1   Aug. 2, 2007

(30) Foreign Application Priority Data
Feb. 2, 2006   (KR) .................. 10-2006-0010087

(51) Int. Cl.
 H01L 35/24 (2006.01)
 H01L 51/00 (2006.01)
(52) U.S. Cl. .............. 257/40; 257/E51.05; 257/E51.051
(58) Field of Classification Search .................. 257/40, 257/E51.05, E51.051
 See application file for complete search history.

(56) References Cited

U.S. PATENT DOCUMENTS

| | | | |
|---|---|---|---|
| 6,977,389 B2 * | 12/2005 | Tripsas et al. ............... 257/40 |
| 2002/0163057 A1 | 11/2002 | Bulovic et al. | |
| 2003/0148142 A1 * | 8/2003 | Fryd et al. ................ 428/690 |
| 2003/0226996 A1 * | 12/2003 | Aramaki et al. ........ 252/62.3 Q |
| 2004/0027849 A1 | 2/2004 | Yang et al. | |
| 2004/0051096 A1 * | 3/2004 | Kingsborough et al. ....... 257/40 |
| 2004/0159835 A1 * | 8/2004 | Krieger et al. ................ 257/40 |
| 2004/0197600 A1 * | 10/2004 | Thompson et al. .......... 428/690 |
| 2004/0224182 A1 * | 11/2004 | Lazarev ...................... 428/690 |
| 2005/0006643 A1 * | 1/2005 | Lan et al. ..................... 257/40 |
| 2005/0045877 A1 * | 3/2005 | Lyons et al. .................. 257/40 |
| 2005/0196637 A1 * | 9/2005 | Herron ....................... 428/690 |

FOREIGN PATENT DOCUMENTS

| JP | 62-95882 | 5/1987 |
|---|---|---|
| JP | 62-095882 | 5/1987 |

OTHER PUBLICATIONS

Y. Segui et al., "Switching in Polystyrene Films: Transition From On To Off State" J. Appl. Phys., vol. 47, No. 1, Jan. 1, 2976.
L. Ma et al., "Organic Nonvolatile Memory by Controling the Dynamic Copper-Ion Concentration Within Organic Layer" Applied Physics Letters, vol. 84, No. 24, Jun. 14, 2004.

* cited by examiner

Primary Examiner—Kenneth A Parker
Assistant Examiner—Anthony Ho
(74) Attorney, Agent, or Firm—Harness, Dickey & Pierce, PLC (57) ABSTRACT

Disclosed herein are organic memory devices and methods for fabricating such devices. The organic memory devices comprise a first electrode, a second electrode and an organic active layer extending between the first and second electrodes wherein the organic active layer is formed from one or more electrically conductive organic materials that contain heteroatoms and which are configured in such a manner as that the heteroatoms are available for linking or complexing metal atoms within the organic active layer. The metal ions may then be reduced to form metal filaments within the organic active layer to form a low resistance state and the metal filaments may, in turn, be oxidized to form a high resistance state and thereby function as memory devices.

7 Claims, 9 Drawing Sheets

● : metal ions

ORGANIC MEMORY DEVICES AND METHODS OF FABRICATING SUCH DEVICES

PRIORITY STATEMENT

This non-provisional application claims priority under 35 U.S.C. §119(a) from Korean Patent Application No. 2006-10087, which was filed on Feb. 2, 2006, in the Korean Patent Office and which is incorporated herein, in its entirety, by reference.

BACKGROUND OF THE EXAMPLE EMBODIMENTS

1. Technical Field

The example embodiments relate to organic memory devices incorporating an electrically conductive organic material containing heteroatoms and methods for fabricating such devices. More specifically, the example embodiments relate to organic memory devices comprising a first electrode, a second electrode and an organic active layer sandwiched therebetween, wherein the organic active layer is formed using an electrically conductive organic material containing heteroatoms, and methods for fabricating such organic memory devices.

2. Description of the Related Art

With the recent dramatic developments in digital communication technology, demand for a variety of memory devices has been increasing rapidly. In particular, non-volatile memory devices suitable for use in applications including, for example, mobile terminals, smart cards, electronic money, digital cameras, game memories, MP3 players, and others, are required for retaining data in memory even when no power is being applied to the memory device, thereby tending to reduce the memory-related power consumption of the device.

Perhaps the most common nonvolatile memories currently being utilized in such applications are flash memories based on silicon materials. Conventional flash memories, however, have inherent technical limitations in that the number of writing/erasing cycles is limited, the writing speed is relatively slow, the production costs of memory chips are increased as a result of the complicated processing currently required for attaining sufficiently high memory densities and certain physical limitations that impede further efforts toward miniaturization. In view of these known limitations of conventional flash memories and the processes for fabricating such devices, efforts have continued toward developing next-generation nonvolatile memory devices that can overcome at least certain of the limitations associated with conventional silicon memory devices and provide one or more advantages over the conventional devices including, for example, increased operating speeds, increased density and/or capacity, reduced power consumption and/or reduced production costs.

Some of these next-generation nonvolatile memories may be generally categorized as, for example, ferroelectric RAMs, magnetic RAMs, phase change RAMs, nanotube memories, holographic memories, organic memories, and/or other groupings that tend to reflect the particular constituent materials used in forming the primary memory cells and/or the particular configuration of the materials and/or structures within the memory cells utilized in the semiconductor memory devices. Organic memories, for example, typically include an upper electrode, a lower electrode and a memory layer formed from an organic material positioned between the upper and lower electrodes to utilize the bistability of resistance values obtained when a voltage is applied between the upper and lower electrodes for storing data.

As utilized in organic memories, these bistability resistance characteristics are exhibited by memory cells formed at the intersections or interfaces between the upper and lower electrodes. Accordingly, these organic memories allow the resistance of the organic material positioned between the upper and lower electrodes to be varied repeatedly between higher and lower values through application of appropriate voltage potentials so that data, i.e., '0' and '1', can be written to and read from a single cell. Such organic memories have attracted increasing attention in recent years as next-generation memories because they provide the desired non-volatility, which is an advantage associated with conventional flash memories, while also providing improved processability, reducing fabrication costs and/or improving the degree of integration.

One example of such an organic memory utilizes a 7,7,8,8-tetracyano-p-quinodimethane (CuTCNQ), which is an organometallic charge transfer complex compound, as the organic material. Another example includes semiconductor devices comprising an upper electrode, a lower electrode and an intermediate layer sandwiched therebetween wherein the intermediate layer is formed from a mixture of an ionic salt, for example, NaCl or CsCl, and a conductive polymer. Other work has suggested organic memory devices comprising organic active layers and a metal nanocluster applied between the organic active layers, but efforts in this area have been hampered by low yields, difficulties in forming suitable metal nanoclusters, and reset voltages of about 0 V, rendering such devices generally unsuitable for widespread use as a nonvolatile organic memory.

Metal filament memories are currently being investigated as an alternative memory structure in which the resistance values may be varied by the formation and dissolution, attenuation or removal of metal filaments within an organic active layer sandwiched between two electrodes. The advantages associated with such metal filament memories may include, for example, reduced fabrication costs, the potential for forming three-dimensional stacking structures, increased retention time, improved thermal stability and/or increased compatibility with flexible substrates. For example, polystyrene films formed from styrene vapor by a glow discharge polymerization technique have shown memory characteristics associated with the formation of metal filaments. However, the formation of metal filaments within polystyrene films have not been demonstrated using more conventional coating techniques, for example, spin coating or spin casting. On the other hand, nonvolatile memory characteristics have been achieved in a metal filament memory device comprising an upper copper electrode, a lower copper electrode and an organic layer formed of a material selected from 2-amino-4,5-imidazoledicarbonitrile (AIDCN), tris-8-(hydroxyquinoline) aluminum (Alq3) and zinc 2,9,16,23-tetra-tert-butyl-29H,31H-phthalocyanine (ZnPC). In each of these metal filament memories, however, the organic active layers are formed using vacuum evaporation and thereby requiring complicated fabrication processing and tending to increase fabrication costs relative to other conventional methods of forming organic layers, e.g., spin-coating.

SUMMARY OF EXAMPLE EMBODIMENTS

Example embodiments are provided below for addressing certain of the deficiencies and/or limitations of the prior art memory devices through the manufacture and use of memory devices that incorporate an electrically conductive organic material containing heteroatoms. Example embodiments of methods which may be used to fabricate such devices using less complicated and/or less expensive fabrication processes including, for example, spin coating or spin casting, are also provided.

Example embodiments include organic memory devices comprising a first electrode, a second electrode and an organic active layer provided between the electrodes wherein the organic active layer is formed from an electrically conductive organic material that contains heteroatoms. Example embodiments of the organic active layers fabricated from such materials will typically exhibit an electrical conductivity of $10^{-12}$ S/cm or greater and will generally include sulfur (S) and/or nitrogen (N) atoms as the heteroatoms. The electrically conductive organic material may be a polymer, a copolymer, a higher order polymer, a single molecule, an oligomer, a dendrimer or mixtures thereof.

Example embodiments of suitable electrically conductive polymers containing heteroatoms include, for example, aniline homopolymers and copolymers, pyrrole homopolymers and copolymers, and vinylpyridine homopolymers and copolymers. Example embodiments of specific materials within these broader classifications include, for example, poly-3-hexylthiophene, polypyrrole, polysiloxane carbazole, polyaniline, poly(1-methoxy-4-(O-disperse red 1))-2,5-phenylene-vinylene and mixtures thereof.

Example embodiments of methods for fabricating organic memory devices comprising a first electrode, a second electrode and an organic active layer provided between the electrodes include forming the organic active layer using an electrically conductive organic material containing heteroatoms.

BRIEF DESCRIPTION OF THE DRAWINGS

Example embodiments described below will be more clearly understood when the detailed description is considered in conjunction with the accompanying drawings, in which.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DESCRIPTION OF EXAMPLE EMBODIMENTS

Example embodiments will now be described in greater detail with reference to the accompanying drawings.

As used herein, the term "organic memory device" generally describes a memory device comprising a first electrode, a second electrode and an organic active layer provided between the electrodes that may be operated to store data by inducing changes in the resistance of the organic active layer associated with the formation and dissolution, attenuation or removal of metal filaments within the organic active layer. In the example embodiments of such organic memory devices, the organic active layer is formed of from an electrically conductive organic material that contains heteroatoms. The memory characteristics of example embodiments of the organic memory devices are achieved through the formation and dissolution, attenuation or removal of metal filaments within the organic active layer.

Figure 1:
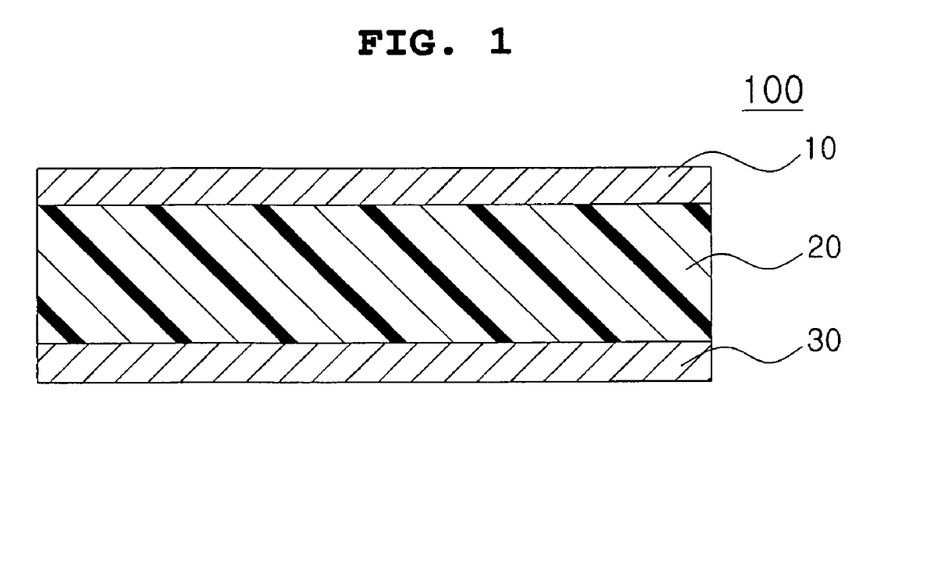
FIG. 1 is a cross-sectional view of a memory device according to one example embodiment.

FIG. 1 is a cross-sectional view of an example embodiment of an organic memory device 100 comprising a first electrode 10, a second electrode 30 and an organic active layer 20 provided between the first and second electrodes. The resistance values of the organic active layer 20 obtained when a voltage is applied to the memory device 100 exhibit bistability, i.e., the organic active layer can exhibit two distinct stable conductivity states at the same applied voltage, that may be utilized as the memory characteristics of the memory device. As the memory characteristics inherent in the organic active layer, these characteristics are maintained in the absence of applied voltage and are suitable for use in non-volatile memory devices.

Figure 2:
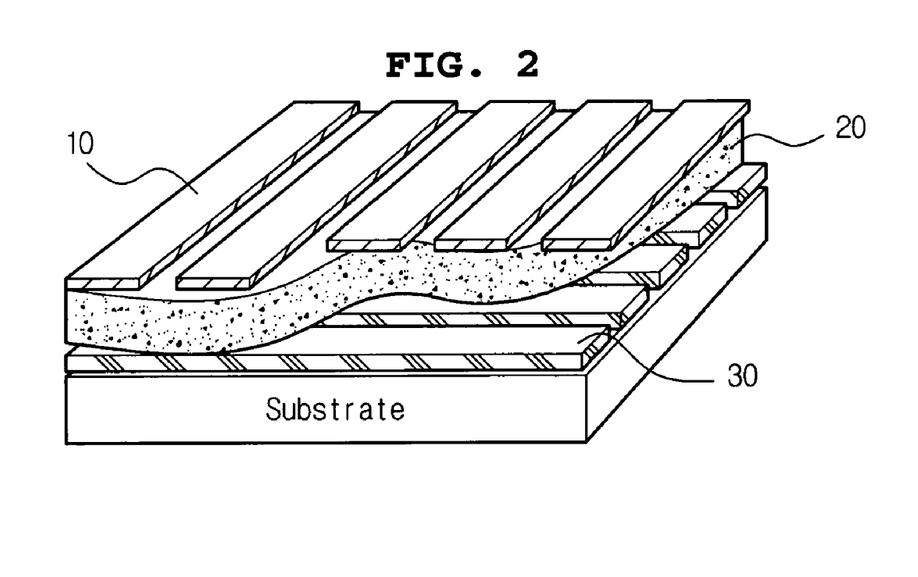
FIG. 2 is a perspective view of a memory matrix employing a memory device according to one example embodiment.

FIG. 2 is a perspective view of an exemplary memory matrix employing the memory device of the example embodiments. As shown in FIG. 2, the memory matrix is formed on a suitable substrate, for example, a glass, plastic or silicon substrate and comprises first electrodes 10 aligned along a first axis, second electrodes 30 aligned along a second axis, and an organic active layer 20 arranged between the first and second electrodes. As noted above, the material used in forming the substrate is not particularly limited and may include conventional organic and/or inorganic materials, for example, glass, silicon, surface-modified glass, polypropylene, activated acrylamide and/or combinations thereof and may be configured as a rigid, semirigid or flexible substrate. As illustrated in FIG. 2, the memory cell matrix includes memory cells defined by overlapping portions of the first and second electrodes 10, 30 and the portion of the organic active layer 20 that extends therebetween. As noted above, the material used in forming the organic active layer 20 is a composition that exhibits the desired bistability characteristics.

Figure 3:
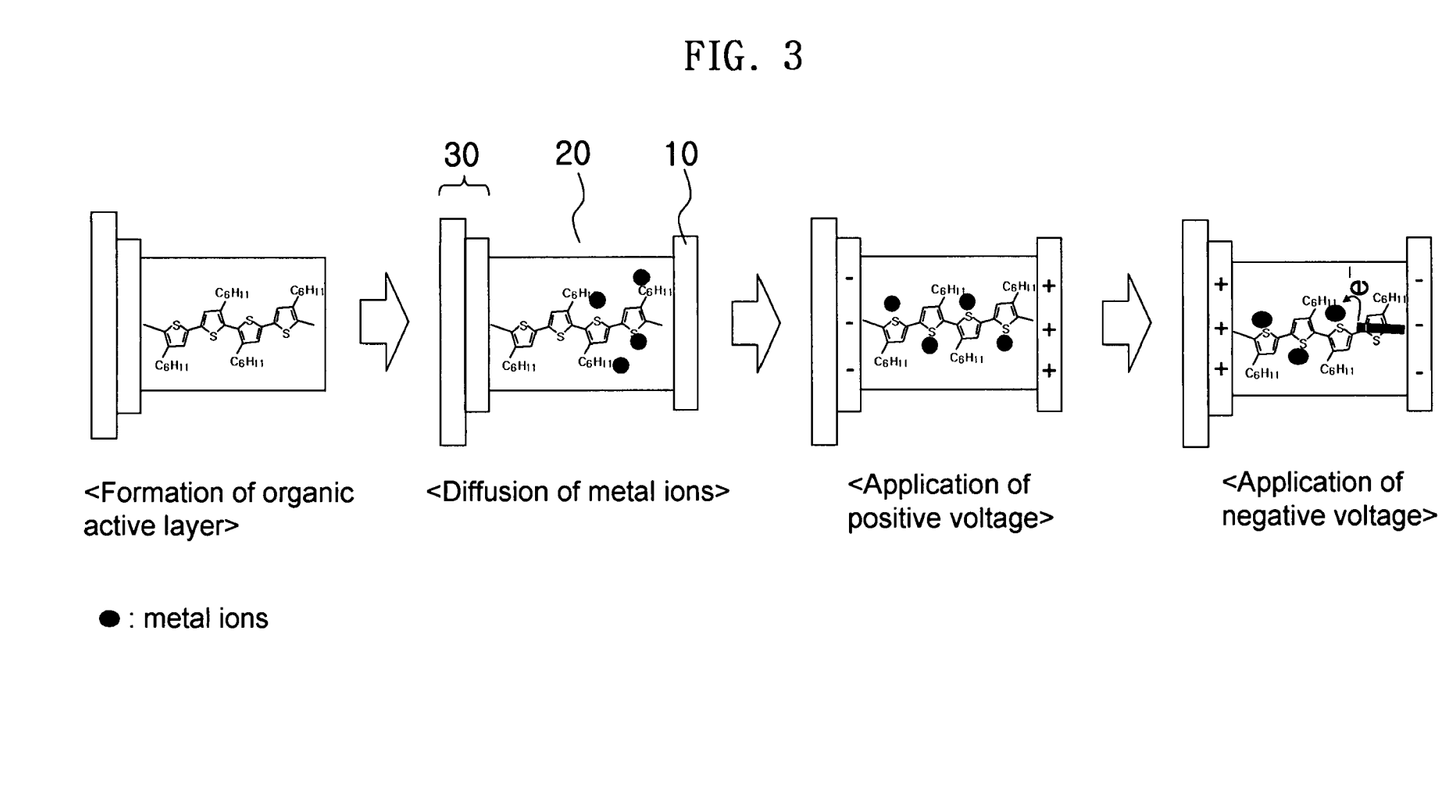
FIG. 3 provides a series of schematic diagrams illustrating the mechanism of switching utilizing the formation of metal filaments in example embodiments of a memory devices.
Figure 4:
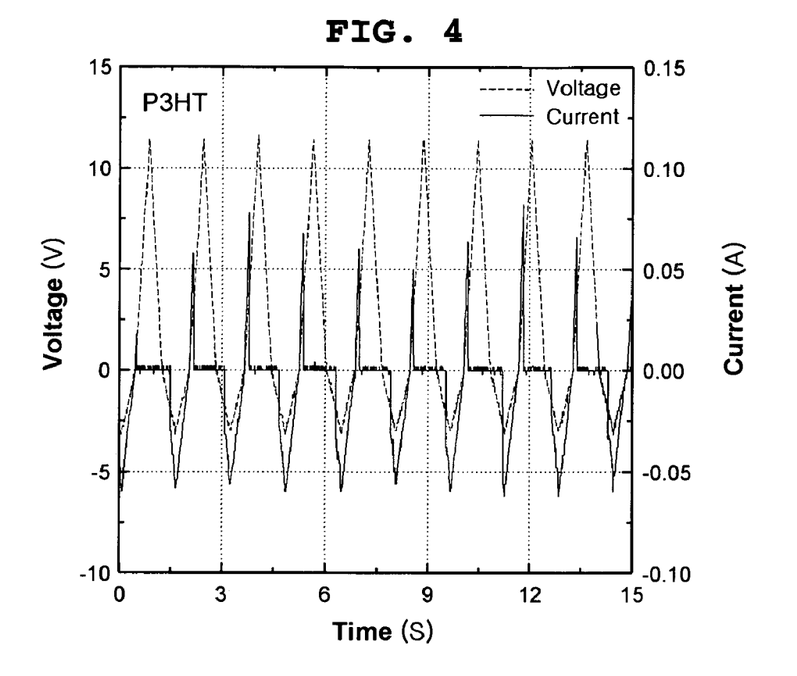
FIG. 4 is a graph showing the current-voltage (I-V) characteristics of a memory device fabricated as described in Example 1.
Figure 5:
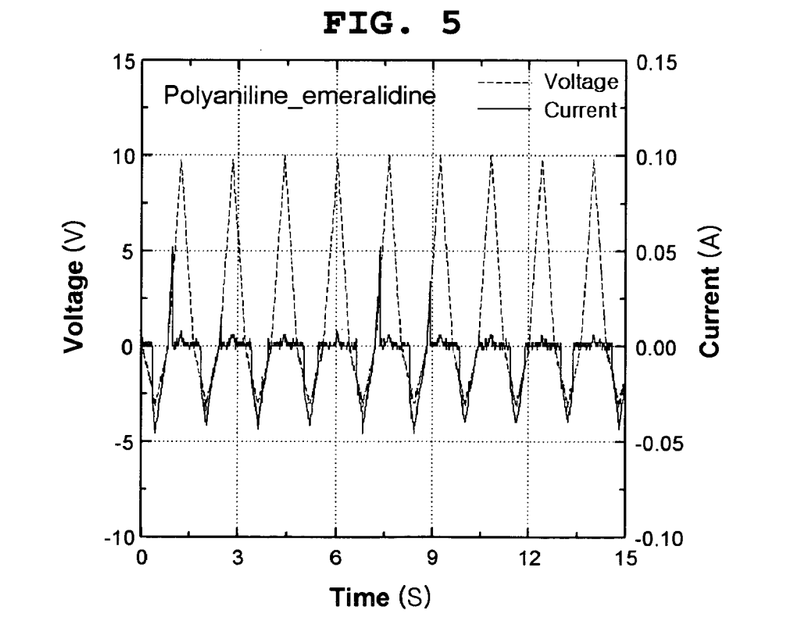
FIG. 5 is a graph showing the current-voltage (I-V) characteristics of a memory device fabricated as described in Example 2.
Figure 6:
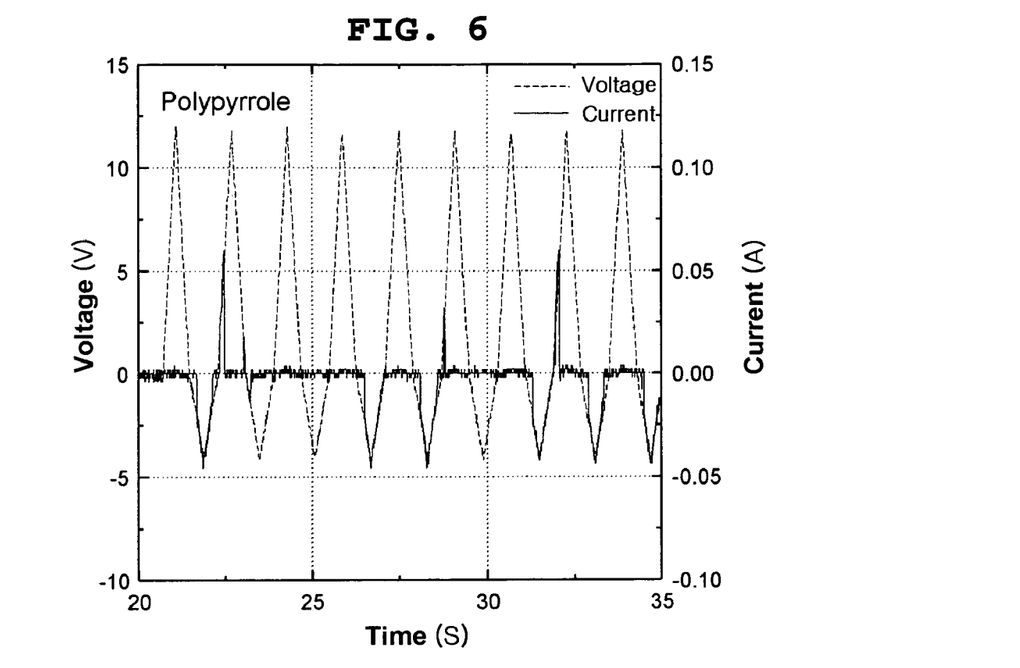
FIG. 6 is a graph showing the current-voltage (I-V) characteristics of a memory device fabricated as described in Example 3.
Figure 7:
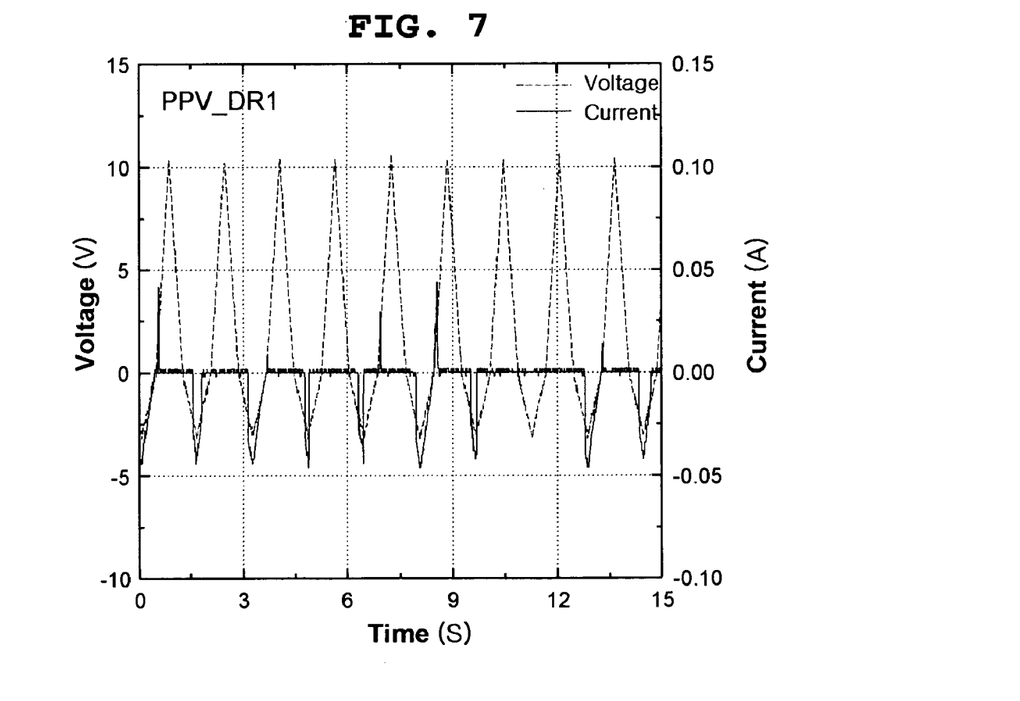
FIG. 7 is a graph showing the current-voltage (I-V) characteristics of a memory device fabricated as described in Example 4.
Figure 8:
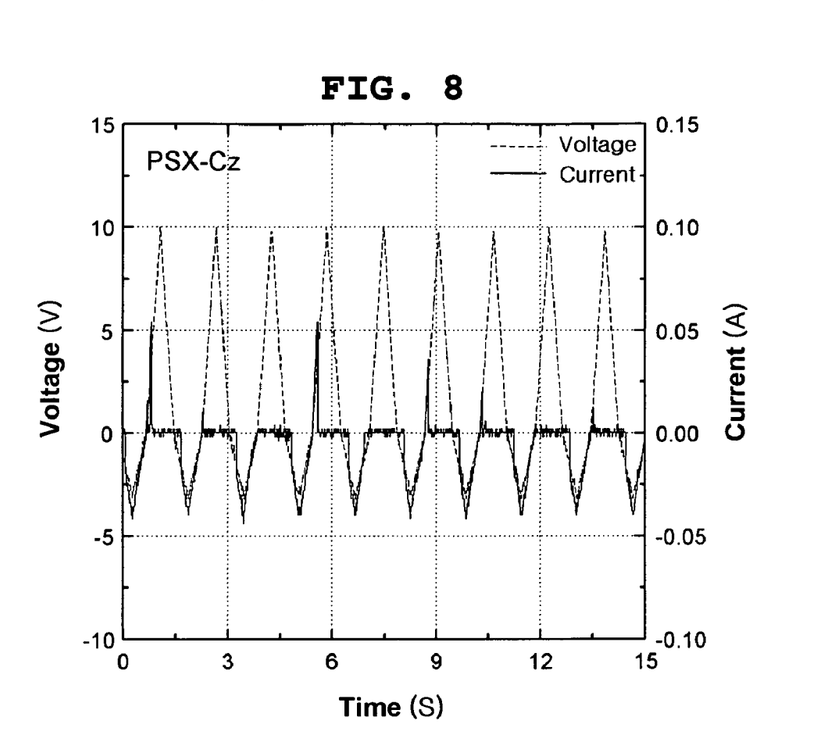
FIG. 8 is a graph showing the current-voltage (I-V) characteristics of a memory device fabricated in Example 5.
Figure 9:
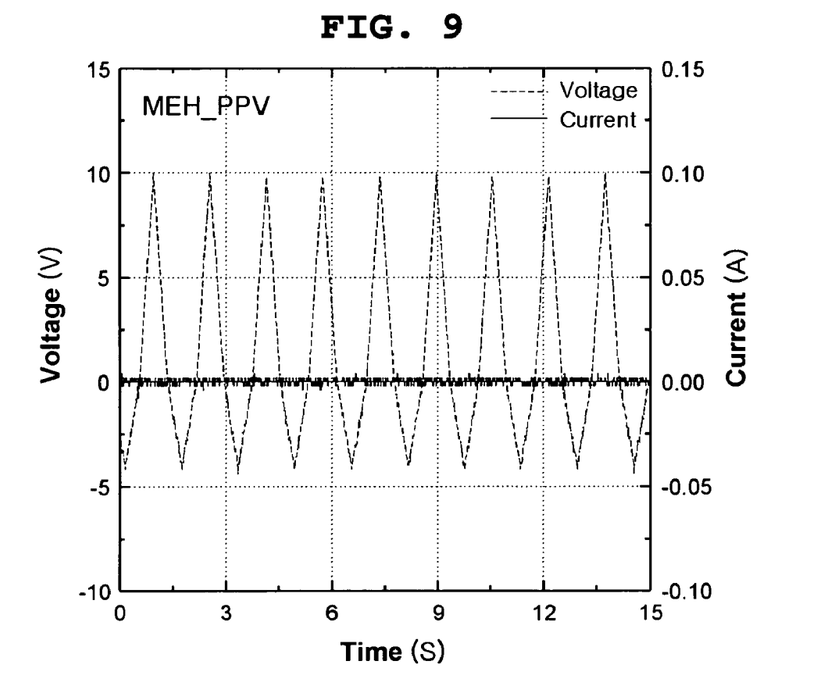
FIG. 9 is a graph showing the current-voltage (I-V) characteristics of a memory device fabricated as described in Comparative Example 1.
Figure 10:
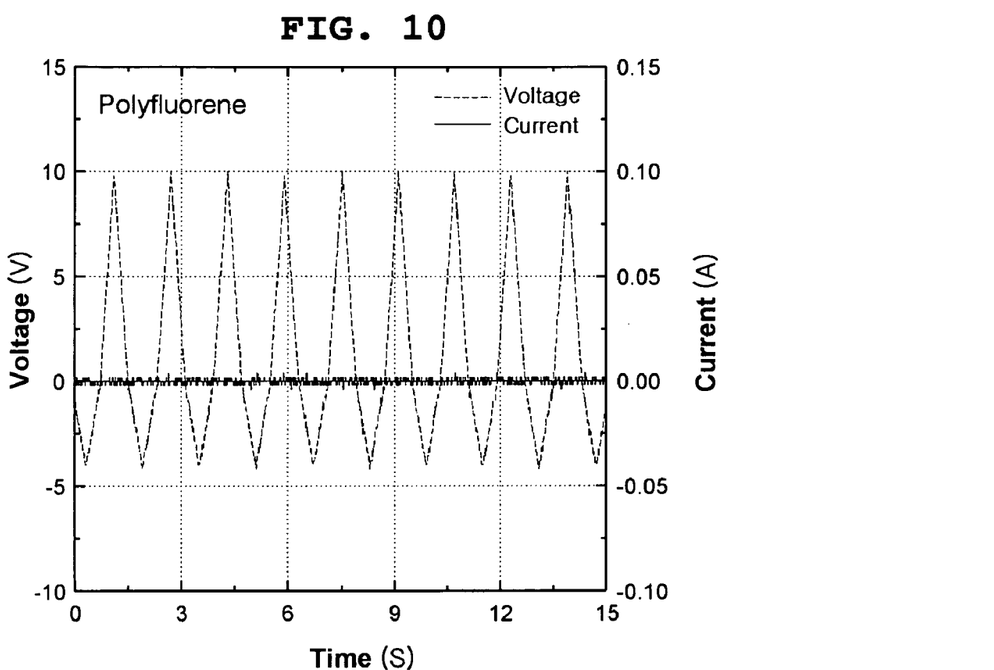
FIG. 10 is a graph showing the current-voltage (I-V) characteristics of a memory device fabricated as described in Comparative Example 2.
Figure 11:
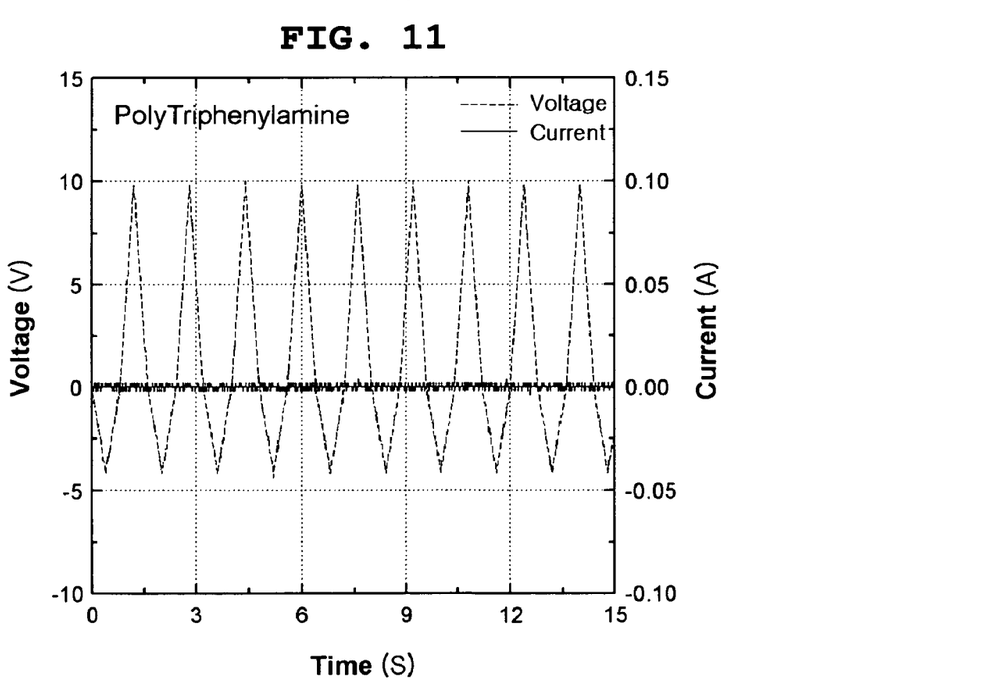
FIG. 11 is a graph showing the current-voltage (I-V) characteristics of a memory device fabricated as described in Comparative Example 3.
Figure 12:
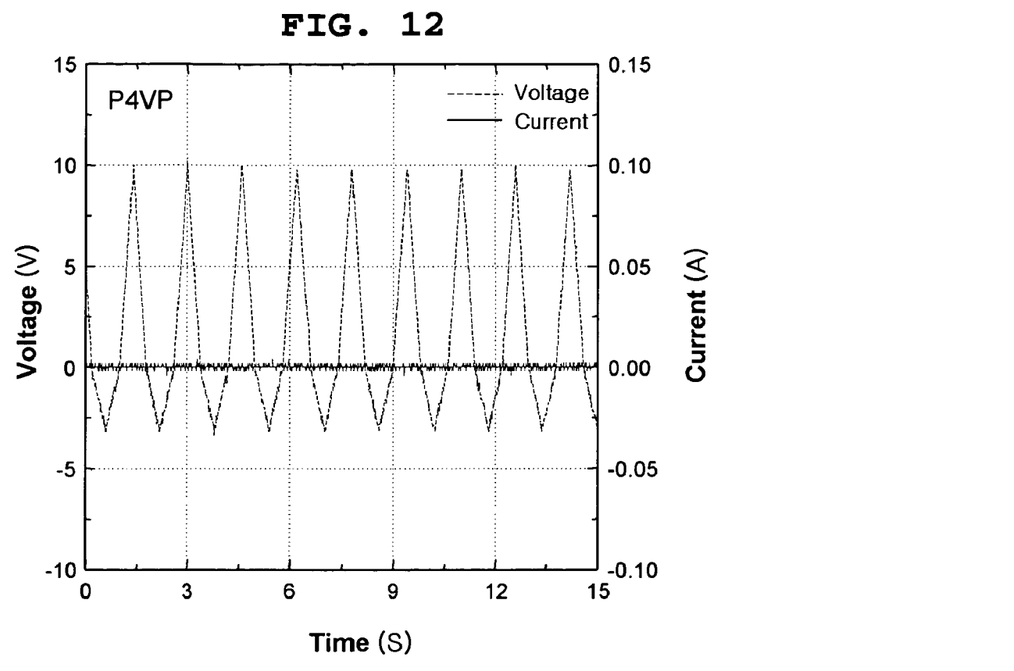
FIG. 12 is a graph showing the current-voltage (I-V) characteristics of a memory device fabricated in Comparative Example 4.
Figure 13:
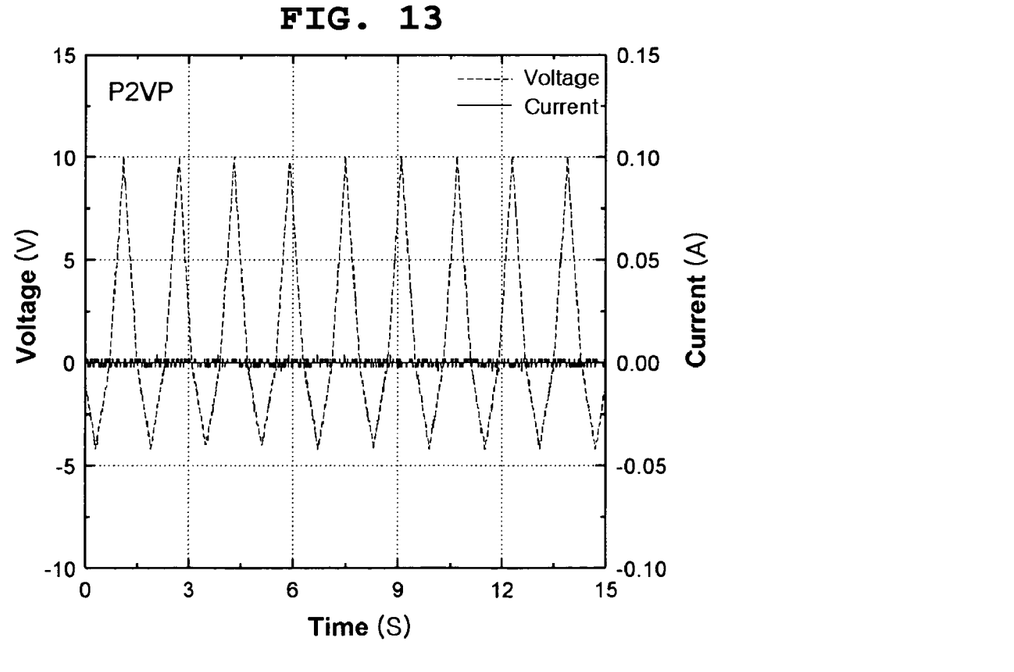
FIG. 13 is a graph showing the current-voltage (I-V) characteristics of a memory device fabricated as described in Comparative Example 5.
Figure 14:
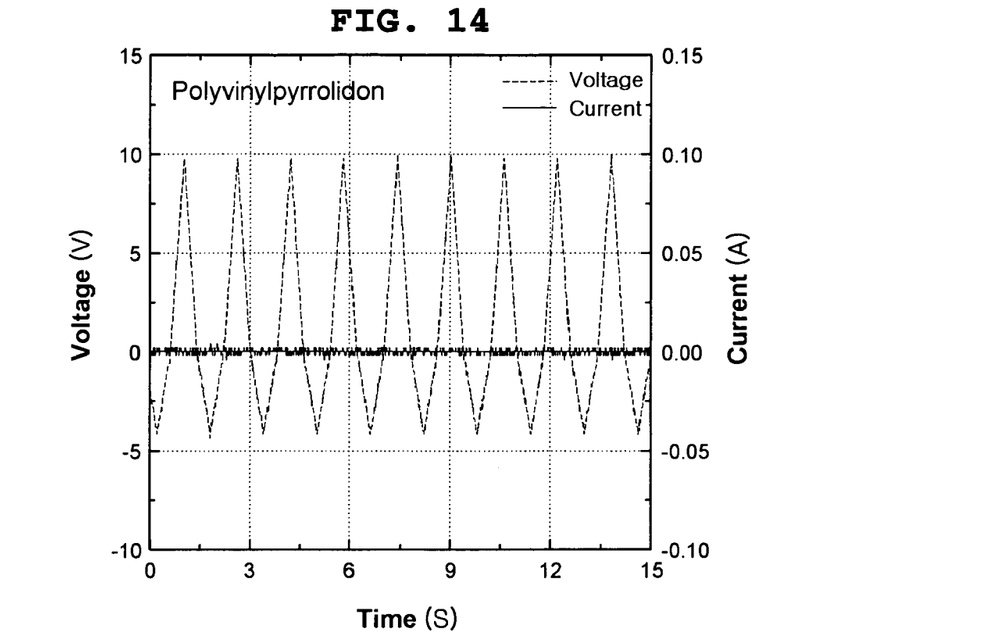
FIG. 14 is a graph showing the current-voltage (I-V) characteristics of a memory device fabricated as described in Comparative Example 6.
Figure 15:
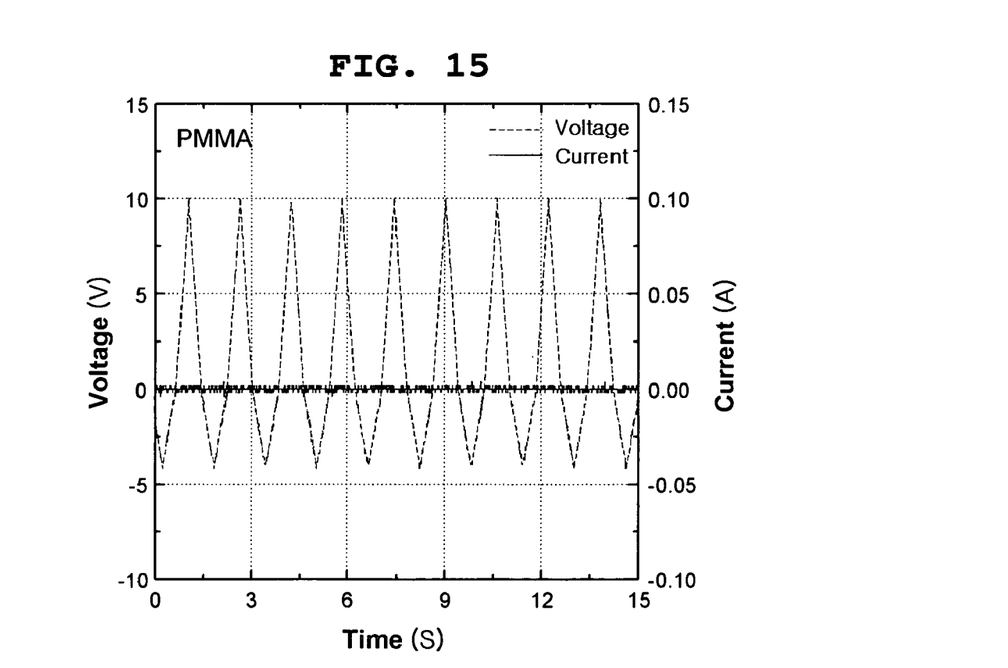
FIG. 15 is a graph showing the current-voltage (I-V) characteristics of a memory device fabricated as described in Comparative Example 7.
Figure 16:
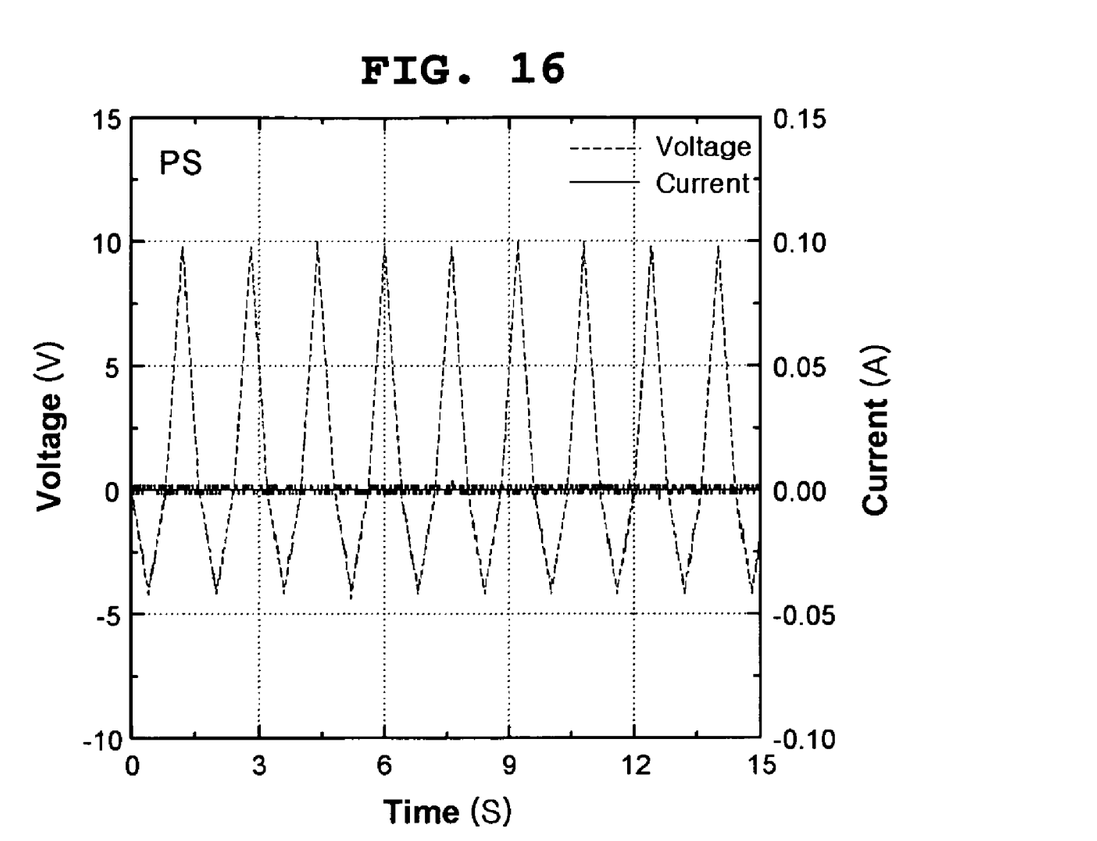
FIG. 16 is a graph showing the current-voltage (I-V) characteristics of a memory device fabricated as described in Comparative Example 8.

Without being bound by theory, it is believed that the switching and memory phenomena of example embodiments of the memory devices may be attributed to the formation and dissolution, attenuation or removal of metal filaments within the organic active layer 20. FIG. 3 illustrates a proposed operating mechanism for example embodiments of the memory devices using an electrically conductive organic material containing heteroatoms according to the example embodiments. As illustrated in FIG. 3, a second electrode 30 coated with a conductive material is formed on a substrate (not shown). The electrically conductive organic material containing heteroatoms may be deposited on a major surface of the second electrode 30 using any suitable coating technique, for example, spin coating or spin casting, to form an organic active layer 20 of sufficient thickness and uniformity by adjusting the operation of the coating apparatus (not shown), the surface properties of the second electrode and/or the viscosity of the organic material. A first electrode 10 is then formed on the organic active layer, after which components, for example, metal ions, from the first electrode 10 may be diffused into the organic active layer 20.

When a positive voltage is applied between the first and second electrodes, the heteroatoms contained in the electrically conductive organic material interact with metal ions diffused from the first electrode to form complexes. The heteroatoms contained in the electrically conductive organic material act as bases relative to the metal ions so that they can interact with the metal ions to form complexes. According to a model based on the hard-soft acid-base principle, it is believed that a hard acid will react predominantly with a hard base and a soft acid will react predominantly with a soft base to form respective complexes. Without being bound by theory, it is further believed that the heteroatoms present in the organic material will tend to become coordinated with the metal ions through lone pairs of electrons present therein.

Without being bound by theory, it is believed that the heteroatoms contained in the electrically conductive organic material and the complexes or chelates that the heteroatoms may form with the metal ions diffusing from the electrode under the influence of a positive voltage will tend to improve the uniformity of the distribution of the metal ions throughout the organic material. Accordingly, under the influence of a negative voltage these metal ions will be reduced and will tend to form generally uniformly distributed metal filaments throughout the organic material, thereby improving the conductivity of the organic material.

The formation of metal filaments between the first and second electrodes depends to some degree on the ability of the bound and/or complexed metal ions to be reduced to form metal filaments within the organic material. Accordingly, the material used in forming the organic active layer must be electrically conductive. In addition, the material used in forming the organic active layer must have a sufficient number and distribution of metal linkable or complexing sites, for example, heteroatoms, whereby the metal ions will be distributed generally uniformly throughout the organic material layer. Accordingly, those materials that exhibit both sufficient electrical conductivity and metal linkable sites can generally be utilized in a metal filament memory, whereas those materials that are generally electrically non-conductive and/or do not incorporate sufficient numbers of metal linkable sites will not tend to show an adequate memory phenomenon to be utilized in a metal filament memory. It is believed, for example, that those electrically conductive organic materials exhibiting an electrical conductivity of $10^{-12}$ S/cm or greater and a sufficient number of metal linking sites, for example, the heteroatoms sulfur (S) and/or nitrogen (N) atoms, may generally be suitable for use in metal filament memories.

When an appropriate electrical voltage is applied between the two electrodes of example embodiments of the memory devices, the organic active layer may be switched between a high resistance state and a low resistance state. That is, the state or condition in which metal filaments are formed between the first and second electrodes becomes a low resistance set state, and the state wherein metal filaments are dissolved or removed becomes a high resistance reset state. Assuming that the low resistance state is defined as data "1," and the high resistance state is defined as data "0," two logic states of the data can be stored in each memory cell.

The configuration of the example embodiments of the electrically conductive organic materials containing heteroatoms that may be used in forming the organic active layers may be a polymer, a copolymer or higher order polymer, a single molecule, an oligomer, a dendrimer and mixtures thereof.

As used herein, the term dendrimers refers to branched or tree-like structures that possess internal cavities and external reactive groups capable of reacting with various chemical units. The growth stages of dendrimers are represented as "generations." The successive addition of repeating units forms the next generations, "first generation," "second generation," and so on. The molecular weight and surface functional groups of dendrimers can be completely controlled during synthesis of the dendrimers, unlike in other polymers, such as polyethylene and polypropylene. Dendrimers are synthesized in a stepwise manner by repeating two or three chemical reactions ("divergent synthesis method"). The dendrimers synthesized in this manner may be configured to have the numbers and types of one or more surface functional groups in the outer generation(s) as desired and/or necessary for a particular application.

The electrically conductive organic material containing heteroatoms may be a polymer selected from homopolymers, copolymers, terpolymers, higher order polymers and mixtures thereof. Example embodiments of electrically conductive polymers containing heteroatoms that may be used in forming organic active layers include, for example, aniline homopolymers and copolymers, pyrrole homopolymers and copolymers, vinylpyridine homopolymers and copolymers and mixtures thereof. Specific examples of electrically conductive organic materials containing heteroatoms include, for example, poly-3-hexylthiophene, polypyrrole, polysiloxane carbazole, polyaniline, poly(1-methoxy-4-(O-disperse red 1))-2,5-phenylene-vinylene, polyindole, polycarbazole, polypyridiazine, polyisothianaphthalene, polyphenylene sulfide, polyvinylpyridine, polypyridine and mixtures thereof.

The range of non-polymeric molecules that may be utilized in forming organic active layers is not especially limited so long as the molecule(s) include sufficient numbers of heteroatoms and is sufficiently conductive. Example embodiments of such molecules include, for example, phthalocyanine and molecules having a structure in which a conductive moiety, for example, carbazole, triphenylamine or triphenyldiamine, is chemically bonded to a heteroatom-containing moiety, such as a nitro, azo, indigo or thioindigo dye.

As will be appreciated by those skilled in the art, the first electrode 10, from which metal ions may be diffused into the organic active layer, will typically comprise one or more metals that may be readily diffused through the organic material(s). Examples of such diffusive metals include, for example, gold, silver, platinum, copper, cobalt, nickel, tin, aluminum and alloys and mixtures thereof. The diffusing metal(s) may be, for example, incorporated into the bulk material of the first electrode, be provided on a primary conductor in a damascene or other recessed pattern and/or provided as a diffusion layer on a primary conductor.

The second electrode 30 may be made of at least one electrically conductive material selected from the group consisting of metals, metal alloys, metal nitrides, metal oxides, metal sulfides, carbon polymers, conductive polymers, and organic conductors. Specific examples of materials for the second electrode include, but are not limited to, aluminum (Al), gold (Au), silver (Ag), platinum (Pt), copper (Cu), titanium (Ti), tungsten (W), indium tin oxide (ITO), as well as alloys, mixtures and combinations thereof.

The organic memory device of the example embodiments may further comprise a barrier layer formed under the first electrode or on the second electrode to prevent damage to the first and/or second electrode resulting from attacks, e.g., dissolution, erosion and/or corrosion, resulting from reactions between the organic material and the surface of the electrodes. If utilized, the barrier layer may be formed from a material selected from the group consisting of $SiO_x$, $AlO_x$, $NbO_x$, $TiO_x$, $CrO_x$, $VO_x$, $TaO_x$, $CuO_x$, $MgO_x$, $WO_x$, $AlNO_x$, and combinations thereof, for example, $SiO_2$, $Al_2O_3$, $Cu_2O$, $TiO_2$ and/or $V_2O_3$. The barrier layer may also be formed of an organic material, such as Alq3, polymethylmethacrylate, polystyrene or PET. The barrier layer should be formed to a thickness and exhibit a uniformity sufficient to provide a satisfactory degree of protection to the electrode during the expected operational life of the final devices. For example, a barrier layer having a thickness of 20 Å to 300 Å may be adequate depending on, for example, the material and the anticipated applications of the device.

As noted above, example embodiments also include methods for fabricating organic memory devices incorporating the structure and materials detailed above. Example embodiments of the methods for fabricating organic memory devices will typically include forming a first electrode, forming a second electrode and forming an organic active layer extending between the first and second electrodes wherein the organic active layer is both electrically conductive and contains heteroatoms in sufficient numbers and reactivity. Example embodiments of the methods include, for example, forming the organic active layer using simple and economical techniques, for example, conventional spin coating or spin casting, thereby reducing or eliminating the need for specialized equipment and fabrication processes, for example, such as electron beam deposition, thereby tending to reduce the processing complexity and expense.

Example embodiments of methods for fabricating memory devices will typically include forming a second electrode on a substrate, coating the second electrode with a suitable conductive organic material containing heteroatoms to form an organic active layer, and forming a first electrode on the organic active layer to complete the basic fabrication of the memory cells that will be incorporated in the organic memory device.

The processes for coating the organic active layer on the second electrode are not particularly limited and may include, for example, spin casting, spin coating, spray coating, electrostatic coating, dip coating, blade coating, roll coating, and ink-jet printing. The thickness of the organic active layer 20 will vary depending on the material, the intended use and the desired operating characteristics, but it is anticipated that organic active layers having a thickness of about 50 Å to about 3,000 Å may be suitable for most applications.

At least one solvent selected from the group consisting of water, chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile and mixtures thereof can be used to form the organic active layer by spin coating. A solvent system or solvent mixture of two or more of the solvents in any miscible ratio may also be used.

The organic active layer sandwiched between the first and second electrodes may be formed into a monolayer or a multilayer consisting of two or more layers. Where the organic active layer has a multilayer structure, the compositions of respective layers may be identical to or different from each other.

The first and second electrodes may be formed by known deposition, formation and/or coating processes, including deposition, e.g., thermal evaporation, sputtering, e-beam evaporation and spin coating.

Hereinafter, example embodiments will be explained in more detail with reference to the following examples. However, these examples are given for the purpose of illustration and are not to be construed as unduly limiting the scope of the disclosure or the following claims.

Example 1

Aluminum was deposited to a thickness of about 80 nm on a glass substrate by thermal evaporation, patterned and etched to form a second electrode. Subsequently, a chlorobenzene solution of poly-3-hexylthiophene (P3HT, 1-2 wt %) was spin-coated at 3,000 rpm on the patterned second electrode and then baked at 110° C. for 30 minutes to form an organic active layer. Copper was then deposited on the organic active layer to a thickness of about 80 nm by thermal evaporation, patterned and etched to form a first electrode, thereby completing fabrication of an example embodiment of a test memory device. During fabrication of this test memory device, the thickness of the organic active layer was controlled to 30-100 nm, as measured using an Alpha-Step™ profilometer. The thicknesses of the deposited electrodes were controlled using a quartz crystal monitor.

Examples 2-5

Memory devices were fabricated in the same manner as described above in connection with Example 1, with the exception that polypyrrole (Example 2), polyaniline (Example 3), poly(1-methoxy-4-(O-disperse red 1))-2,5-phenylenevinylene (Example 4) and polysiloxane carbazole (Example 5) were used, respectively, as the electrically conductive organic materials containing heteroatoms in forming the organic active layer.

Comparative Examples 1-3

Memory devices were fabricated in the same manner as described above in Example 1, with the exception that poly [2-methoxy-5,2-(ethylhexyloxy-1,4-phenylene-vinylene] (Comparative Example 1), polyfluorene (Comparative Example 2) and poly(triphenylamine) (Comparative Example 3), compounds that, while electrically conductive, are essentially devoid of metal linkable sites, were used as materials for the organic active layer.

Comparative Examples 4-6

Memory devices were fabricated in the same manner as described above in Example 1, with the exception that poly (4-vinylpyridine) (Comparative Example 4), poly(2-vinylpyridine) (Comparative Example 5) and polyvinylpyrrolidone (Comparative Example 6), compounds that include metal linkable sites but that are essentially electrically non-conductive, were used as materials for the organic active layer.

Comparative Examples 7 and 8

Memory devices were fabricated in the same manner as described above in Example 1, with the exception that polymethylmethacrylate (Comparative Example 7) and polystyrene (Comparative Example 8), compounds which are generally devoid of metal linkable site and which are also essentially electrically non-conductive, were used as materials for the organic active layer.

The organic materials and solvents used in Examples 1 to 5 and Comparative Examples 1 to 8, the presence or absence of metal linkable sites in the organic materials, and the mobility of the organic materials are summarized in TABLE 1 below.

characteristics as changes in current. The results of these tests are shown in FIGS. 4 to 16.

As is evident from the graphs shown in FIGS. 4 to 8, the test memory devices, which were fabricated using an organic material containing heteroatoms and having an electrical conductivity of $10^{-12}$ S/cm or greater, were capable of being switched between a high resistance state and a low resistance state in response to the voltage applied to the devices. In addition, the graphs of FIGS. 4 to 8 show that the switching phenomenon was reproducible as indicated by the ten cycles or more cycles illustrated for each of the test memory devices. It was also observed that both of the two distinct resistance states could be maintained by the test memory device even when no voltage or current was applied. In addition, because the resistance states can be read by monitoring current flow at relatively low voltages, the test memory devices according to the Examples can be utilized as memory devices.

In contrast, no switching was observed in the memory devices of Comparative Examples 1 to 3 (FIGS. 9 to 11), which were fabricated using an organic material having no metal linkable site. For example, although triphenylamine moieties have hole conductivity and contain a heteroatom (i.e., a nitrogen atom), the phenyl groups delocalize the lone electron pair of the heteroatom so that electrons are not localized in the heteroatom but are distributed in a resonance structure throughout the molecule. Accordingly, the metal coordination of the heteroatoms, which is an inherent characteristic of heteroatoms, is softened, thus compromising the ability of the heteroatoms in the triphenylamine groups to link or otherwise form a complex with a metal ion. As a result, it is believed that the heteroatoms are unable to contribute in any significant manner to the formation of metal filaments within the organic active layer.

Similar results were observed, i.e., no switching phenomenon in the test memory devices fabricated as described in

TABLE 1

| Example No. | Organic material | Solvent | Metal linkable site | Mobility |
| --- | --- | --- | --- | --- |
| Ex. 1 | Poly-3-hexylthiophene | Chlorobenzene | Thiophene | $10^{-3}$–$10^{-4}$ |
| Ex. 2 | Polypyrrol | Water | Pyrrole | 0.1 |
| Ex. 3 | Polyaniline | N-methylpyrrolidone | Aniline | $10^{-5}$ |
| Ex. 4 | poly(1-methoxy-4-(O-disperse red 1))-2,5-phenylene-vinylene | Chloroform | DR1 | $10^{-5}$–$10^{-6}$ |
| Ex. 5 | Polysiloxane carbazole | Chloroform | Carbazole | $10^{-6}$–$10^{-7}$ |
| Comp. Ex. 1 | Poly[2-methoxy-5,2-(ethylhexyloxy)-1,4-phenylene-vinylene] | Chloroform | — | $10^{-5}$–$10^{-6}$ |
| Comp. Ex. 2 | Polyfluorene | Chloroform | — | $10^{-3}$–$10^{-4}$ |
| Comp. Ex. 3 | Poly(triphenylamine) | Chloroform | — | $10^{-5}$–$10^{-6}$ |
| Comp. Ex. 4 | Poly(4-vinylpyridine) | N,N'-dimethylformamide | Pyridine | $<10^{-12}$ |
| Comp. Ex. 5 | Poly(2-vinylpyridine) | Chloroform | Pyridine | $<10^{-12}$ |
| Comp. Ex. 6 | Polyvinylpyrrolidone | Chloroform | Pyrrolidone | $<10^{-12}$ |
| Comp. Ex. 7 | Polymethylmethacrylate | Chloroform | — | $<10^{-12}$ |
| Comp. Ex. 8 | Polystyrene | Chloroform | — | $<10^{-12}$ |

Test Example 1

Test for Switching Characteristics of Memory Devices

A voltage was applied to each of the test memory devices fabricated in the manner described above in Examples 1 to 5 and Comparative Examples 1 to 8 to evaluate the switching Comparative Examples 4 to 6 (see, FIGS. 12 to 14) and Comparative Examples 7 and 8 (FIGS. 15 and 16), in which the organic active layers were fabricated using either electrically non-conductive organic materials having metal linkable sites or electrically non-conductive organic materials having no metal linkable sites. These results indicate that those organic memory devices fabricated in accord with Examples 1-5, i.e., those which utilized an organic material that is both electrically conductive and which contains heteroatoms capable of acting as metal linking sites, may be fabricated by simple and economical processes, for example, spin casting and/or spin coating, while still exhibiting improved switching characteristics.

Although certain examples have been disclosed above for illustrative purposes, those skilled in the art will appreciate that various modifications and variations of the materials and processes are possible, without departing from the scope and spirit of the disclosure and should not, therefore, be interpreted as unduly limiting the scope of the claims

What is claimed is:

1. An organic memory device comprising:
a first electrode,
a second electrode; and
an organic active layer sandwiched between and physically contacting the first electrode and the second electrode, wherein the organic active layer is an electrically conductive organic material containing heteroatoms and metal ions and further wherein the first electrode, second electrode, and organic active layer are configured to effectuate a resistance change within the organic active layer by facilitating the formation or removal of metal filaments within the organic active layer,
wherein the electrically conductive organic material is selected from a group consisting of polymers, single molecules, oligomers, dendrimers and mixtures thereof, and
wherein the electrically conductive organic material includes a single molecule which includes a conductive moiety selected from a first group consisting of carbazole, triphenylamine, triphenyldiamine and mixtures thereof and which is bonded to a heteroatom-containing moiety selected from a group consisting of nitro, azo, indigo and thioindigo dyes and mixtures thereof.

2. The organic memory device according to claim 1, wherein:
the organic active layer has an electrical conductivity of $10^{-12}$ S/cm or greater.

3. The organic memory device according to claim 1, wherein:
the heteroatoms contained in the organic active layer are selected from a group consisting of sulfur (S) and nitrogen (N).

4. The organic memory device according to claim 1, wherein: electrically conductive organic material is selected from a group consisting of homopolymers, copolymers, terpolymers and mixtures thereof.

5. The organic memory device according to claim 1, wherein: the electrically conductive organic material is selected from a group consisting of aniline homopolymers and copolymers, pyrrole homopolymers and copolymers, vinylpyridine homopolymers and copolymers, and mixtures thereof.

6. The organic memory device according to claim 1, wherein: the electrically conductive organic material is selected from a group consisting of poly-3-hexylthiophene, polypyrrole, polysiloxane carbazole, polyaniline, poly(1-methoxy-4-(O-disperse red 1))-2,5-phenylene-vinylene, polyindole, polycarbazole, polypyridiazine, polyisothianaphthalene, polyphenylene sulfide, polyvinylpyridine, polypyridine and mixtures thereof.

7. The organic memory device according to claim 1, wherein:
the first and second electrodes each include a conductive material independently selected from a group consisting of gold (Au), silver (Ag), platinum (Pt), copper (Cu), cobalt (Co), nickel (Ni), tin (Sn), aluminum (Al), and alloys, combinations and mixtures thereof.

* * * * *